United States Patent
Lee et al.

(10) Patent No.: US 7,057,537 B2
(45) Date of Patent: Jun. 6, 2006

(54) SYSTEMS, METHODS AND DEVICES FOR SAMPLING RATE CONVERSION BY RESAMPLING SAMPLE BLOCKS OF A SIGNAL

(75) Inventors: Eun-jik Lee, Gyeonggi-do (KR); Dong-Young Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/062,648

(22) Filed: Feb. 22, 2005

(65) Prior Publication Data

US 2005/0219081 A1    Oct. 6, 2005

(30) Foreign Application Priority Data

Mar. 29, 2004    (KR) ............... 10-2004-0021149

(51) Int. Cl.
*H03M 7/00*    (2006.01)
(52) U.S. Cl. ......................... 341/61; 332/103
(58) Field of Classification Search ............. 341/61; 332/103; 375/222, 324; 84/603; 348/441; 370/532; 708/313; 329/304
See application file for complete search history.

(56) References Cited

U.S. PATENT DOCUMENTS

| | | | |
|---|---|---|---|
| 5,199,046 A * | 3/1993 | Ling | 375/222 |
| 5,331,346 A * | 7/1994 | Shields et al. | 348/441 |
| 5,641,926 A * | 6/1997 | Gibson et al. | 84/603 |
| 5,774,598 A * | 6/1998 | Sunshine et al. | 382/250 |
| 5,913,190 A | 6/1999 | Fielder et al. | |
| 6,226,661 B1 * | 5/2001 | Savell | 708/313 |
| 6,236,283 B1 * | 5/2001 | Koslov | 332/103 |
| 6,252,453 B1 * | 6/2001 | Nayler | 329/304 |
| 6,347,123 B1 * | 2/2002 | Mathe et al. | 375/324 |
| 6,489,901 B1 * | 12/2002 | Venkitachalam et al. | 341/61 |
| 6,493,361 B1 * | 12/2002 | Yamaguchi et al. | 370/532 |
| 6,509,850 B1 | 1/2003 | Bland | |
| 6,531,969 B1 * | 3/2003 | Chu | 341/61 |
| 2002/0046227 A1 | 4/2002 | Goszewski et al. | |
| 2003/0184368 A1 * | 10/2003 | Li et al. | |

FOREIGN PATENT DOCUMENTS

| | | |
|---|---|---|
| JP | 10-126218 | 5/1998 |
| KR | 2001-0112790 A | 12/2001 |
| KR | 10-2002-0068159 | 8/2002 |

OTHER PUBLICATIONS

Notice to Submit a Response for Korean patent application No. 10-2004-0021149 mailed on Sep. 28, 2005.

* cited by examiner

*Primary Examiner*—Jean Bruner Jeanglaude
(74) *Attorney, Agent, or Firm*—Myers Bigel Sibley & Sajovec, PA

(57) ABSTRACT

A signal is converted from a first sampling rate to a second sampling rate by dividing the signal into sample blocks and resampling the sample blocks at a sampling rate that is no higher than a maximum of the first sampling rate or the second sampling rate. The signal may be divided into sampling blocks by dividing the signal into a greatest common factor of the first and second sampling rates of sample blocks per second, wherein a respective sample block includes the first sampling rate divided by the greatest common factor, of samples.

27 Claims, 4 Drawing Sheets

SYSTEMS, METHODS AND DEVICES FOR SAMPLING RATE CONVERSION BY RESAMPLING SAMPLE BLOCKS OF A SIGNAL

RELATED APPLICATION

This application claims the benefit under 35 USC §119 of Korean Patent Application No. 2004-0021149, filed Mar. 29, 2004, the disclosure of which is hereby incorporated herein by reference in its entirety as if set forth fully hereby.

FIELD OF THE INVENTION

The present invention relates to digital signal processing systems, methods and devices, and more specifically to sampling rate conversion systems, methods and devices.

BACKGROUND OF THE INVENTION

A sampling rate conversion apparatus is used to convert a digital signal with a first sampling rate (or a first sampling frequency) into a digital signal with a second sampling rate (or a second sampling frequency). Exemplary sampling rate conversion techniques are disclosed in U.S. Pat. Nos. 6,509,850 and 5,913,190, U.S. Published Application No. 2002/0046227 and Published Korean Application No. 2001-0112790.

FIG. 1 is a block diagram schematically showing a conventional audio reproducing system that includes sampling rate conversion. Referring to FIG. 1, the conventional audio reproducing system 100 includes an audio storage unit 110, an audio signal input unit 120, a processor 130, a digital-to-analog converter (DAC) 150, and an audio signal output unit 160. The conventional audio reproducing system 100 may be a karaoke, a CD (Compact Disc) player, a DVD (Digital Versatile Disc) player and/or an MP3 (MPEG layer 3) player.

The audio signal storage unit 110 can include a storage medium such as a CD or a DVD. The audio signal storage unit 110 supplies a second digital audio stream (or a digital audio signal) AUD12 to the processor 130. For example, a sampling rate of a digital audio stream output from a CD is 44.1 kHz and a sampling rate of a digital audio signal output from a DVD is 48 kHz.

The audio signal input unit 120 may include a digital audio input unit such as a microphone. The audio signal input unit 120 supplies a first digital audio stream AUD11 to the processor 130. For example, a sampling rate of a digital audio stream output from the microphone may be 8 kHz.

The processor 130 operates as a controller and includes a mixer 131, a sampling rate detector 132, and a resampler 140. The sampling rate detector 132 and the resampler 140 can act as a sampling rate conversion apparatus.

The sampling rate conversion apparatus converts a sampling rate of the first digital audio stream (hereinafter referred to as an input stream) AUD11 and generates a third digital audio stream (hereinafter referred to as an output stream) AUD13 with the same sampling rate as the second digital audio stream AUD12. The sampling rate of the first digital audio stream AUD11 may be referred to as a current sampling rate of the first digital audio stream AUD11. Moreover, the sampling rate of the second digital audio stream AUD12 may be referred to as a target sampling rate to be converted.

The mixer 131 mixes the second digital audio stream AUD12 with the output stream AUD 13. The mixer 131 is included in the processor 130 in FIG. 1, but the mixer 131 can be located outside the processor 130.

The DAC 150 converts a digital audio signal output from the mixer 131 to an analog audio signal and supplies the analog audio signal to the audio signal output unit 160 for reproducing an audio signal. The audio signal output unit 160 may be a speaker.

The sampling rate detector 132 detects the sampling rate of the second digital audio stream AUD12 and the sampling rate of the input stream AUD11, and supplies respective integer factors SR12 and SR11, corresponding to the respective sampling rates, to a respective upsampler 141 and a downsampler 143 included in the resampler 140. If the input stream AUD11, is an output signal of a microphone and the second digital audio stream AUD12 is an output signal of a CD, the second integer factor SR12 can be 441 and the first integer factor SR11 can be 80.

The resampler 140 includes the upsampler 141, a low-pass filter (LPF) 142 and the downsampler 143. The upsampler 141 increases the sampling rate of the input stream AUD11 by a multiple of the second integer factor SR12 in response to the second integer factor SR12. If the input stream AUD11 is an output signal of a microphone and the second digital audio stream AUD12 is an output signal of a CD, then 8 kHz as the sampling rate of the input stream AUD11 is 441-fold (SR12) increased by the upsampler 141. That is, the upsampler 141 increases the sampling rate of the input stream AUD11 up to a sampling rate corresponding to a least common multiple (that is, 8000×441=3528 (kHz)) of the sampling rates of the input stream AUD11 and the second audio stream AUD12.

The LPF 142 performs low-pass filtering of the input stream AUD11 with the increased sampling rate to thereby cancel or reduce sources of aliasing, in order to prevent or reduce aliasing.

The down sampler 143 decreases the sampling rate of the input stream AUD11 by a multiple of the first integer factor SR11 in response to the first integer factor SR11. For example, if the input stream AUD11 is an output signal of a microphone and the second digital audio stream AUD12 is an output signal of a CD, then the downsampler 143 decreases, by 80 fold, 3528 kHz (that is, 8000×441=3528 (kHz)) which is the sampling rate of the input stream increased by the upsampler 141 and generates an output stream AUD13 with a sampling rate of 44100 Hz.

SUMMARY OF THE INVENTION

Exemplary embodiments of the present invention convert a signal from a first sampling rate to a second sampling rate, wherein the first and second sampling rates are not related as integer multiples. Conversion may take place, according to some embodiments of the present invention, by dividing the signal to sample blocks and resampling the sample blocks at a sampling rate that is no higher than a maximum of the first sampling rate or the second sampling rate. In other embodiments, the signal is divided into sampling blocks by dividing the signal into a greatest common factor of the first and second sampling rates of sample blocks per second, wherein a respective sample block includes the first sampling rate divided by the greatest common factor, of samples. In other embodiments, resampling the sample blocks is performed by resampling the sample blocks at a sampling rate that is a maximum of the first sampling rate divided by the greatest common factor or the second sampling rate divided by the greatest common factor.

Accordingly, some embodiments of the present invention can resample the signal from the first sampling rate to the second sampling rate, without performing intermediate resampling at a rate that is higher than a maximum of the first sampling rate or the second sampling rate. When the second sampling rate is higher than the first sampling rate, resampling may be performed by upsampling the signal from the first sampling rate to the second sampling rate, without performing intermediate upsampling at a rate that is higher than the second sampling rate, i.e., without performing intermediate downsampling.

Embodiments of the present invention can reduce or eliminate the need for a large number of calculations that may be performed by a low pass filter due to the high sampling rate that may be obtained using a conventional upsampler and downsampler. For example, where conventional sampling rate conversion resamples a sampling rate of 8 kHz to a high frequency such as 44.1 kHz which is not an integer multiple of 8 kHz, a large number of calculations may need to be performed to low-pass filter the input stream AUD11 with the sampling rate of 3528 kHz increased by the upsampler. In particular, when resampling from a sampling rate of 8 kHz to a sampling rate of 44.1 kHz is performed, a conventional sampling rate conversion converts 8 kHz to 3528 kHz and then converts 3528 kHz to 44.1 kHz. Low-pass filtering of a stream of 3528 kHz may have an 80 fold calculation increase compared to low pass-filtering of a stream of 44.1 kHz. If the low pass filtering of the stream of 44.1 kHz uses 1.5 MIPS (Million Instruction Per Second), 120 MIPS may be used to low-pass filter the stream of 3528 kHz. This may be difficult to implement by an existing RISC (Reduced Instruction Set Computer).

According to other embodiments of the present invention, sampling rate conversion methods for an input stream decide a conversion rate of samples included in sample blocks into which an input stream is divided. A sampling rate of the samples included in the sample blocks is converted using the conversion rate that was decided. Filtering and resampling is performed on the samples at the converted sampling rate.

In some embodiments, one or more conversion rates are provided to the samples. Moreover, the converting of the sampling rate of the samples included in the sample blocks may be performed by multiplying the sampling rate of the samples included in the sample blocks by the conversion rate of the samples that was decided. In some embodiments, the resampling is upsampling and the filtering is low-pass filtering.

In other embodiments, the conversion rate is decided by detecting a current sampling rate of the input waveform and supplying a first integer factor corresponding to the detected current sampling rate and detecting the target sampling rate and supplying a second integer factor corresponding to the detected target sampling rate. A number of sample blocks per second of the input stream and a size of the sample blocks is decided, using a greatest common factor of the first integer factor and the second integer factor. Finally, the input stream is divided into the sample blocks, using the number of sample blocks per second.

In some embodiments, converting is performed by converting the sampling rate of samples included in the sample blocks by multiplying the sampling rate of the samples by the conversion rate that was decided and filtering the samples at the converted sampling rate. The filtering may be low-pass filtering.

In other embodiments, a determination is made as to whether an additional sample block is received. If it is determined that an additional sample block is received, converting is continued. If it is determined that no additional sample block is received, converting is terminated.

According to other embodiments of the present invention, there is provided a sampling rate conversion apparatus that includes a sampling rate detector that is configured to detect a current sampling rate and a target sampling rate of an input stream and to output a first integer factor and a second integer factor corresponding respectively to the detected current sampling rate and the target sampling rate. A sample block processor is configured to decide the number of sample blocks per second of the input stream and a size of the sample blocks using the first and second integer factors, to divide the input stream into the sample blocks, and to decide a conversion rate of samples included in the sample blocks. In some embodiments, a sample block input unit continuously receives the sample blocks included in the input stream from the sample block processor and determines whether or not the sample blocks are received. A resampler is configured to convert a sampling rate of the samples included in sample blocks using the conversion rate of the samples provided by the sample block processor, and filtering and resampling the samples at the converted sampling rate.

In some embodiments, one or more conversion rates are provided to each of the samples by the sample block processor. Moreover, the sample block processor can be configured to decide the number of the sample blocks per second and the size of the sample block, using a greatest common factor of the first and second integer factors, in some embodiments. In some embodiments, the resampler is configured to convert the sampling rate of the samples included in the sample blocks by multiplying the sampling rate of the samples included in the sample blocks by the conversion rate of the samples. The filtering performed by the resampler can be low-pass filtering. Moreover, in other embodiments, the resampler includes an upsampler that is configured to multiply the sampling rate of the samples included in the sample block by the conversion rate of the samples and to convert the sampling rate of the samples, and a filter that is configured to filter the samples with the converted sampling rate.

According to yet other embodiments of the present invention, there is provided an audio reproducing system that includes an audio signal input unit that is configured to generate a first digital audio stream and an audio signal storage unit that is configured to generate a second digital audio stream. A processor is configured to resample a sampling rate of the generated first digital audio stream into a sampling rate of the generated second digital audio stream, to mix a first digital audio stream having the resampled sampling rate with the second digital audio stream, and to output a digital audio signal. A digital-to-analog converter is configured to convert the output digital audio signal of the processor into an analog audio signal. An audio signal output unit is configured to reproduce an audio signal in response to the analog audio signal. The resampling performed by the processor converts a sampling rate of samples included in sample blocks into which the first digital audio stream is divided using a predetermined conversion rate, and filters the samples at the converted sampling rate.

In some embodiments, in the resampling, one or more conversion rates are provided to each of the samples. Moreover, in other embodiments, in the resampling, the sampling rate of the samples is converted by multiplying the sampling rate of the samples included in the sample blocks by the conversion rate of the samples. In some embodiments, the resampling is upsampling and the filtering performed in the resampling is low-pass filtering. Moreover, the audio signal input unit can include a microphone, the audio signal storage unit can include a compact disk, and the audio signal output unit can include a speaker. Finally, the processor can include a mixer that is configured to mix a first digital audio stream at the resampled sampling rate with the second digital audio stream.

DETAILED DESCRIPTION

Figure 1:
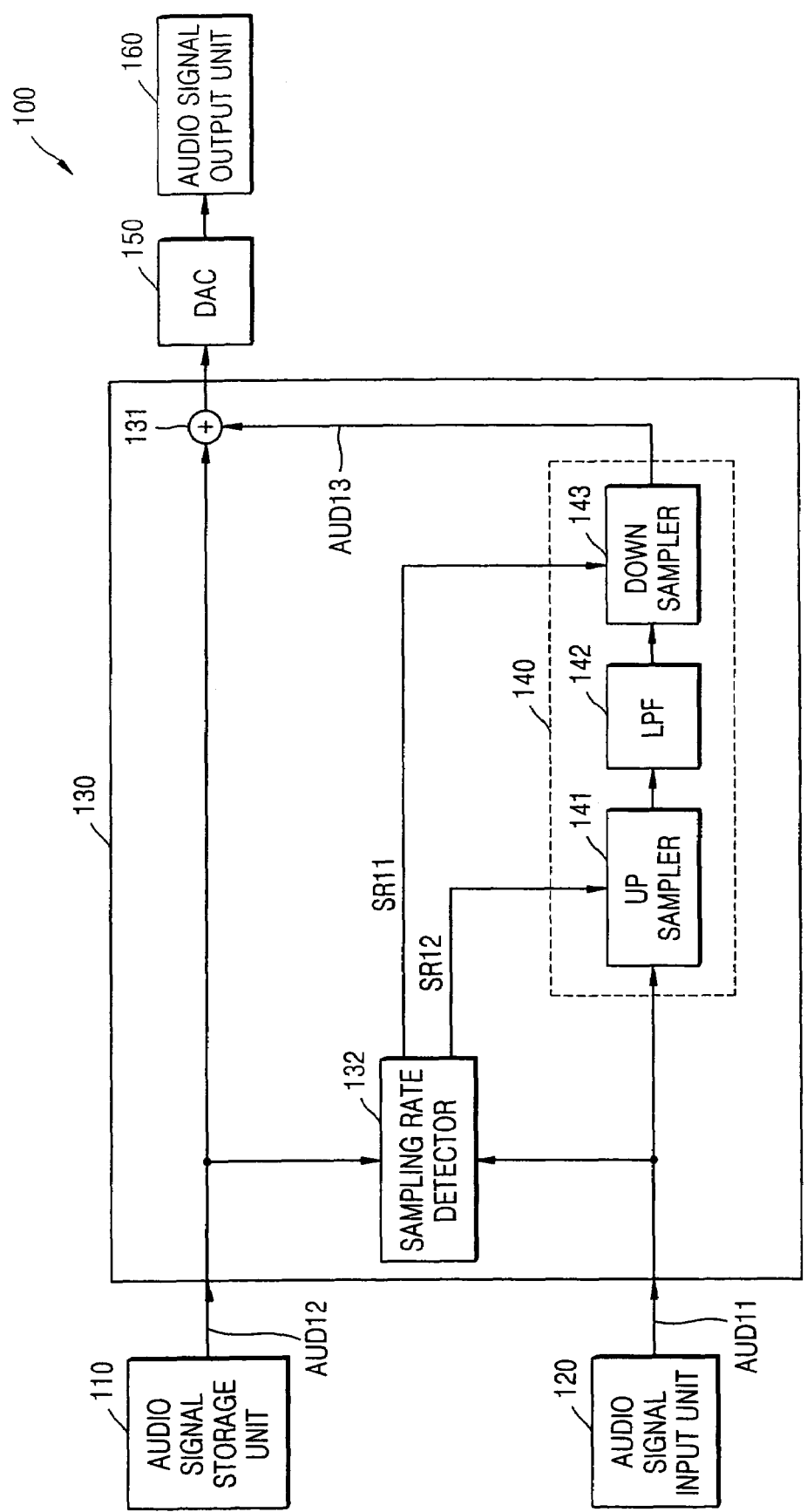
FIG. 1 is a block diagram of a conventional audio reproducing system.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
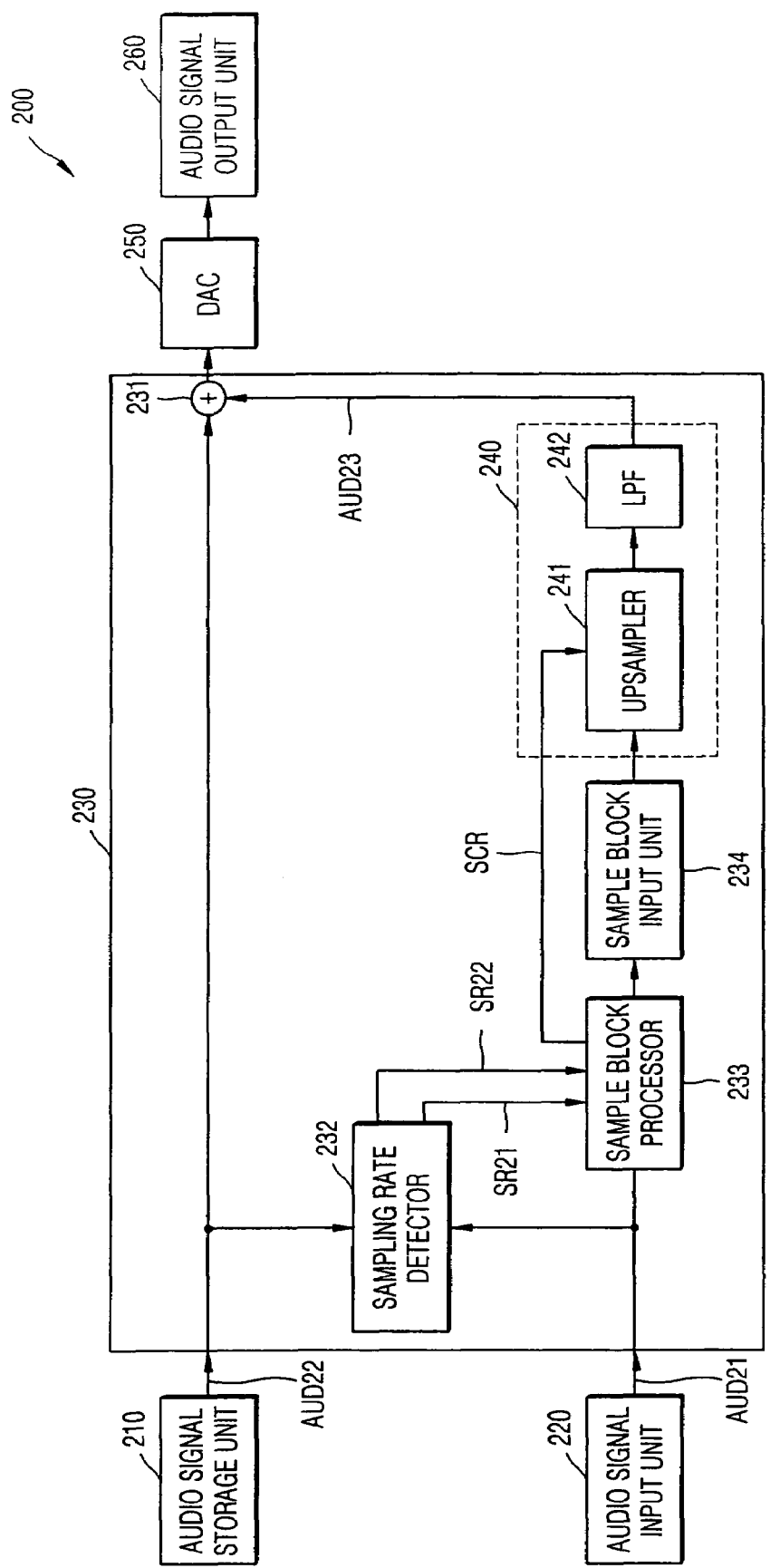
FIG. 2 is a block diagram of an audio reproducing system and/or method according to some embodiments of the present invention.

FIG. 2 is a block diagram of an audio reproducing system and/or method according to some embodiments of the present invention.

Referring to FIG. 2, an audio reproducing system and/or method 200 according to some embodiments of the present invention includes an audio signal storage unit 210, an audio signal input unit 220, a processor 230, a digital-to-analog converter (DAC) 250, and an audio signal output unit 260.

The audio reproducing system 200 may be a karaoke, a CD (Compact Disc) player, a DVD (Digital Versatile Disc) player and/or an MP3 (MPEG layer 3) player.

The audio signal storage unit 210 may include a storage medium such as a CD or a DVD. The audio signal storage unit 210 supplies a second digital audio stream (or a digital audio signal) AUD22 to the processor 230. For example, a sampling rate of a digital audio stream output from a CD is 44.1 kHz and a sampling rate of a digital audio signal output from a DVD is 48 kHz.

The audio signal input unit 220 may include a digital audio input unit such as a microphone. The audio signal input unit 220 supplies a first digital audio stream AUD21 to the processor 230. For example, a sampling rate of a digital audio stream output from a microphone may be 8 kHz.

The processor 230 operates as a controller and includes a mixer 231, a sampling rate detector 232, a sample block processing unit 233, a sample block input unit 234, and a resampler 240. The sampling rate detector 232, the sample block processor 233, the sample block input unit 234, and the resampler 240 can act as a sampling rate conversion apparatus and perform a sampling rate conversion method, according to various embodiments of the present invention.

The sampling rate conversion apparatus/method converts a sampling rate of a first digital audio stream (hereinafter referred to as an input stream) AUD21 and generates a third digital audio stream (hereinafter referred to as an output stream) AUD23 with the same sampling rate as the second digital audio stream AUD22. The sampling rate of the first digital audio stream AUD21 may be referred to as a current sampling rate of the first digital audio stream AUD21. Moreover, the sampling rate of the second digital audio stream AUD22 may be referred to as a target sampling rate to be converted.

The mixer 231 mixes the second digital audio stream AUD22 with the output stream AUD23. The mixer 231 is included in the processor 230 in FIG. 2, but the mixer 131 can be located outside the processor 230 in other embodiments.

The DAC 250 converts a digital audio signal output from the mixer 231 to an analog audio signal and supplies the analog audio signal to the audio signal output unit 260 for reproducing an audio signal. The audio signal output unit 260 may include a speaker.

Hereinafter, a sampling rate conversion apparatus and/or method according to embodiments of the invention will be described in detail. The sampling rate detector 232 detects a sampling rate of an input stream AUD21 and a sampling rate of a second digital audio stream AUD22, respectively, and supplies integer factors SR21 and SR22, corresponding to the respective detected sampling rates, to the sample block processor 233. In some embodiments, if the input stream AUD21 is an output signal of a microphone and the second digital audio stream AUD22 is an output signal of a CD, a first integer factor SR21 corresponding to the input stream AUD21 can be 8000 and a second integer factor SR22 corresponding to the second digital audio stream AUD22 can be 44100.

The sample block processor 233 decides the number of sample blocks per second of the input stream AUD21 and a size of a sample block, using a greatest common factor of the first integer factor SR21 and the second integer factor SR22. For example, if the input stream AUD21 is an output signal of a microphone and the second digital audio stream AUD22 is an output signal of a CD, the greatest common factor of the first integer factor SR21 and the second integer factor SR22 is 100 since the current sampling rate is 8000 Hz and the target sampling rate is 44100 Hz. Accordingly, the number of sample blocks per second is 100 and the size of a sample block is 80 samples.

Also, the sample block processor 233 divides the input stream AUD21 into a plurality of sample blocks using the decided number of sample blocks. For example, if a current sample rate is 8000 Hz and a target sampling rate is 44100 Hz, the input stream AUD21 is divided into 100 sample blocks per second.

Also, the sample block processor 233 decides a conversion rate SCR of samples included in a sample block and supplies the decided conversion rate SCR to an upsampler 241 included in the resampler 240. In some embodiments, the sampling block processor 233 may decide a plurality of conversion rates SCR. If a constant conversion rate SCR is provided, a resampling operation from a sampling rate to an integer multiple of the sampling rate can be performed, and if two or more conversion rates SCR are provided, a resampling operation from a sampling rate to a different sampling rate not being an integer multiple of the sampling rate can be performed.

The sample block input unit 234 successively receives sample blocks included in the input stream AUD21 from the sample block processor 233. Also, the sample block input unit 234 determines whether or not a sample block is received from the sample block processor 233, and supplies a received sample block to the upsampler 241 of the resampler 240. In some embodiments, a sample block input unit 234 need not be provided.

The resampler 240 includes the upsampler 241 and a low-pass filter (LPF) 242. The upsampler 241 upsamples a sampling rate of samples included in a received sample block by a conversion rate SCR of the samples, and supplies the upsampled result to the LPF 242. The upsampler 241 converts the sampling rate of the samples by multiplying the sampling rate of the samples included in the received sample block by the conversion rate SCR of the samples.

The LPF 242 performs low-pass filtering of the input stream AUD21 with the increased sampling rate to reduce or cancel sources of aliasing, in order to reduce or prevent aliasing. The LPF 242 generates an output stream AUD23 with the same sampling rate as a sampling rate of the second digital audio stream AUD22.

The input stream input to the sampling rate conversion apparatus/method according to the above-described embodiments of the present invention is a digital audio stream. However, a digital video stream can be input to a sampling rate conversion apparatus/method in other embodiments. Also, a sampling conversion apparatus/method according to embodiments of the present invention described above performs upsampling when resampling. However, in other embodiments, the sampling conversion apparatus/method can also perform downsampling when resampling.

Figure 3:
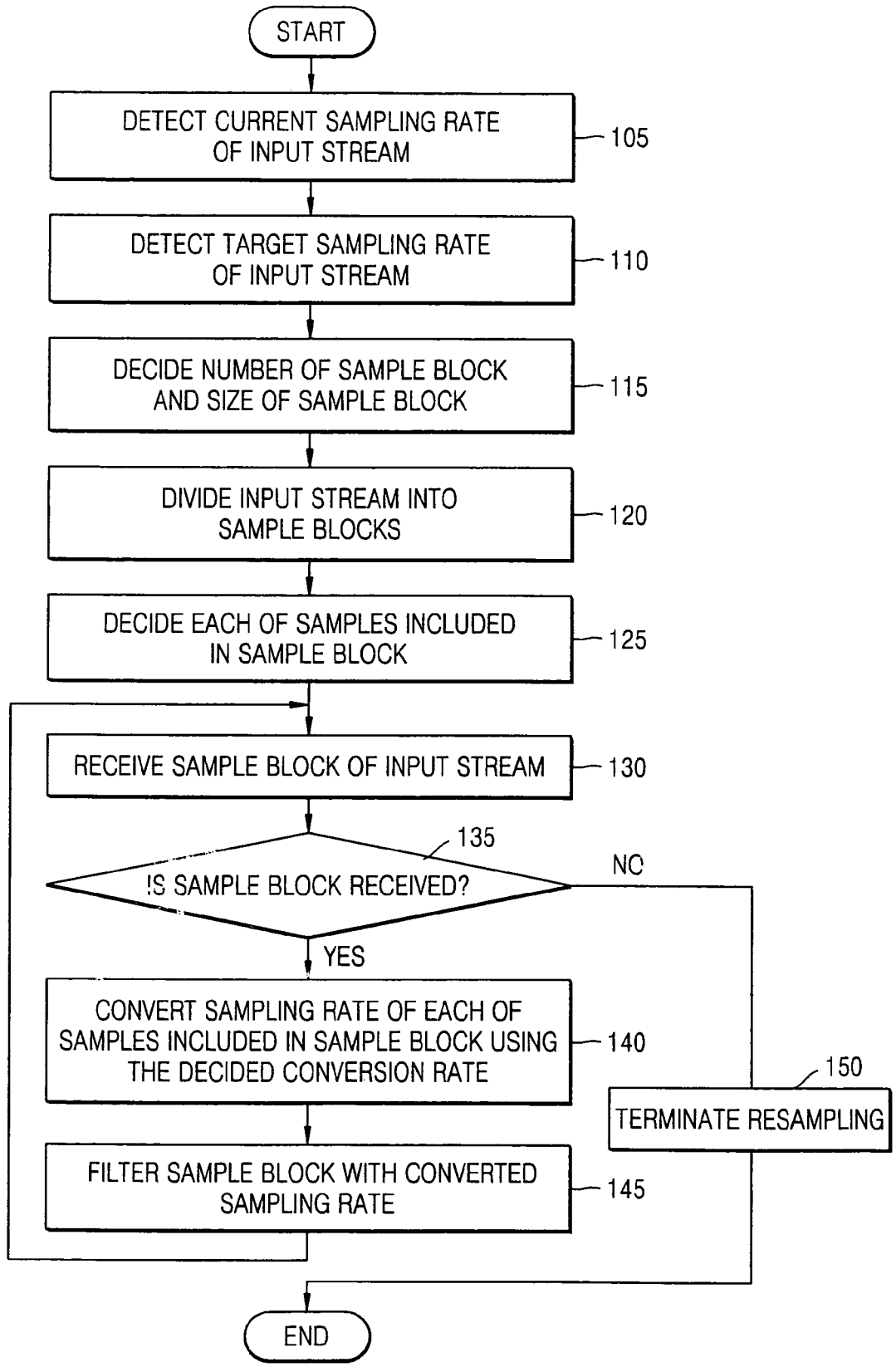
FIG. 3 is a flowchart illustrating sampling rate conversion according to some embodiments of the present invention.

FIG. 3 is a flowchart illustrating sampling rate conversion operations according to various embodiments of the present invention. The sampling rate conversion operations shown in FIG. 3 can be applied to the sampling rate conversion apparatus/method shown in FIG. 2.

Referring to FIGS. 2 and 3, in Block 105, the sampling rate detector 232 detects a current sampling rate of an input stream AUD21, and detects a target sampling rate of the input stream AUD21 in Block 110. In Block 115, the sample block processor 233 decides the number of sample blocks per second, by which the input stream AUD21 is divided, and a size of a sample block, using a greatest common factor of a first integer factor SR21 corresponding to the current sampling rate of the input stream AUD21 and a second integer factor SR22 corresponding to the target sampling rate of the input stream AUD21. For example, if the current sampling rate is 8000 Hz and the target sampling rate is 44100 Hz, the greatest common factor is 100, the number of sample blocks per second is 100, and the size of a sample block is 80 samples.

In Block 120, the sample block processor 233 divides the input stream AUD21 into a plurality of sample blocks using the number of sample blocks per second decided in Block 115. For example, if the current sampling rate is 8000 Hz and the target sampling rate is 44100 Hz, the input stream AUD21 is divided into 100 sample blocks per second.

In Block 125, the sample block processor 233 decides a conversion rate of samples included in the sample blocks that were divided in Block 120. If the target sampling rate is not an integer multiple of the current sampling rate, a plurality of conversion rates are provided in some embodiments. Alternatively, if the target sampling rate is an integer multiple of the current sampling rate, a single conversion rate is provided in some embodiments.

An embodiment where resampling from 8 kHz to 44.1 kHz is performed when the target sampling rate is not an integer multiple of the current sampling rate will now be described. In this case, the following simultaneous equations can apply:

$$X+Y=80; \text{ and}$$

$$5X+6Y=441.$$

Coefficients "5" and "6" of X and Y in the above simultaneous equations indicate conversion rates. Accordingly, as a solution satisfying the above simultaneous equations, X=39 and Y=41 may be obtained.

Here, X indicates the number (that is, 39) of samples whose sampling rates are upsampled by 5 times and Y indicates the number (that is, 41) of samples whose sampling rates are upsampled by 6 times. The conversion rate of each of samples included in the sample block will be described in more detail later with reference to FIG. 4.

Referring again to FIG. 3, in Block 130, the sample block input unit 234 receives a sample block from the sample block processor 233. In Block 135, the sample block input unit 234 determines whether a sample block is received from the sample block processor 233. If it is determined in Block 135 that a sample block is received, operations proceed to Block 140. If it is determined in Block 135 that no sample block is received, the process proceeds to Block 150.

In Block 140, the upsampler 241 converts a sampling rate of samples included in the sample block, using the conversion rate decided in Block 125. That is, the upsampler 241 multiplies the sampling rate of the samples included in the sample block by the conversion rate of the samples decided in Block 125, thereby converting the sampling rate of the samples. Accordingly, in Block 140, the sample rates of samples included in a sample block can increase.

In Block 145, the LPF 242 performs low-pass filtering of the sample block in which the sampling rate of each of samples is converted in Block 140. After operations of Block 145 are terminated, the operations return to Block 130. That is, until a sampling rate of the input stream AUD21 is changed from the current sampling rate to the target sampling rate, Blocks 140 and 145 are repeated. In Block 150, the sampling rate conversion terminates resampling.

Accordingly, when sampling rate conversion according to some embodiments of the present invention is applied to upsampling from 8 kHz to 44.1 kHz, 8 kHz is directly upsampled to 44.1 kHz without being upsampled to 3528 kHz and then low-pass filtering is performed, so that an amount of calculation can be reduced by, for example, 80 times compared to a conventional technique.

Figure 4:
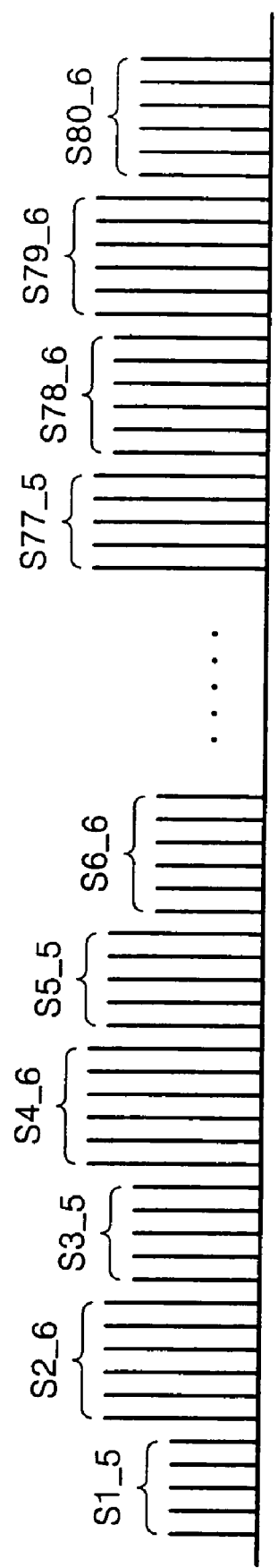
FIG. 4 illustrates a correlation between a sample block of an input stream and a sample block of an output stream generated with a sampling rate conversion apparatus or method according to some embodiments of the present invention.

Sampling rate conversion according to embodiments the present invention can be applied to a case where an input stream is a digital audio stream or a digital video stream. Moreover, sampling conversion was described herein according to embodiments of the present invention by performing upsampling. However, downsampling also may be performed in other embodiments. FIG. 4 is illustrates a correlation between a sample block of an input stream and a sample block of an output stream that may be generated when a sampling rate conversion apparatus and/or method according to embodiments of the present invention is used.

FIG. 4 shows an example of samples (S1_5, S2_6, S3_5, S4_6, S5_5, S6_6, . . . , S77_5, S78_6, S79_6, and S80_6) included in sample blocks of an output stream, corresponding to samples included in sample blocks of an input stream. That is, FIG. 4 shows sample blocks of an output stream with the conversion rates as the solution of the simultaneous equations described with reference to FIG. 3.

The reference number S1_5 indicates a first sample included in a sample block of an output stream, which is generated when a sampling rate of a first sample included in a sample block of an input stream is upsampled by 5 times. Likewise, the reference number S2_6 indicates a second sample included in the sample block of the output stream, which is generated when a sampling rate of a second sample included in the sample block of the input stream is upsampled by 6 times. The remaining reference numbers S3_5 through S80_6 except for S1_5 and S2_6 indicate corresponding samples, respectively. Also, the size of the sample block of the input stream corresponding to the sample block of the output stream is 80 samples.

In the sample block of the output stream, samples with a conversion rate of 5 times and samples with a conversion rate of 6 times appear alternately, and samples S79_6 and S80_6 with a conversion rate of 6 times appear at the last stage of the sample block. Thus, when a sampling rate is resampled to a different sample rate which is not an integer multiple of the sampling rate, two or more conversion rates may be used.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A sampling rate conversion method for an input stream comprising:

deciding a conversion rate of samples included in sample blocks into which the input stream is divided, wherein deciding the conversion rate comprises:
detecting a current sampling rate of the input stream and supplying a first integer factor corresponding to the detected current sampling rate;
detecting a target sampling rate for the input stream and supplying a second integer factor corresponding to the detected target sampling rate;
deciding a number of sample blocks per second of the input stream and a size of the sample blocks, using a greatest common factor of the first integer factor and the second integer factor; and
dividing the input stream into the sample blocks, using the number of sample blocks per second; and
converting a sampling rate of the samples included in the sample blocks using the conversion rate that was decided, and filtering and resampling the samples at the converted sampling rate.

2. The method of claim 1, wherein in deciding a conversion rate, one or more conversion rates are provided to the samples.

3. The method of claim 2, further comprising:
determining whether an additional sample block is received;
continuing converting if it is determined that an additional sample block is received; and
terminating converting if it is determined that an additional sample block is not received.

4. The method of claim 2, wherein converting comprises:
converting the sampling rate of samples included in the sample blocks by multiplying the sampling rate of the samples by the conversion rate that was decided; and
filtering the samples at the converted sampling rate.

5. The method of claim 4, wherein the filtering is low-pass filtering.

6. The method of claim 1, wherein the converting the sampling rate of the samples included in the sample blocks is performed by multiplying the sampling rate of the samples included in the sample blocks by the conversion rate of the samples that was decided.

7. The method of claim 1, wherein the resampling is upsampling.

8. The method of claim 1, wherein the filtering is low-pass filtering.

9. A sampling rate conversion apparatus comprising:
a sampling rate detector that is configured to detect a current sampling rate and a target sampling rate of an input stream and to output a first integer factor and a second integer factor corresponding respectively to the detected current sampling rate and the target sampling rate;
a sample block processor that is configured to decide a number of sample blocks per second of the input stream and a size of the sample blocks using a greatest common factor of the first and second integer factors, to divide the input stream into the sample blocks, and to decide a conversion rate of samples included in the sample blocks; and
a resampler that is configured to convert a sampling rate of samples included in the sample blocks using the conversion rate of the samples provided by the sample block processor, and filtering and resampling the samples at the converted sampling rate.

10. The apparatus of claim 9, wherein one or more conversion rates are provided for the samples by the sample block processor.

11. The apparatus of claim 10, wherein the resampler comprises:
  an upsampler that is configured to multiply the sampling rate of the samples included in the sample block by the conversion rate of the samples and to convert the sampling rate of the samples; and
  a filter that is configured to filter the samples with the converted sampling rate.

12. The apparatus of claim 11, wherein the filtering performed by the filter is low-pass filtering.

13. The apparatus of claim 9, wherein the resampler is configured to convert the sampling rate of the samples included in the sample blocks, by multiplying the sampling rate of the samples included in the sample blocks by the conversion rate of the samples.

14. The apparatus of claim 9, wherein the filtering performed by the resampler is low-pass filtering.

15. A system of converting a signal from a first sampling rate to a second sampling rate, wherein the first and second sampling rates are not related as integer multiples, the system comprising:
  a sample block processor that is configured to divide the signal into a greatest common factor of the first and second sampling rates of sample blocks per second, wherein a respective sample block includes the first sampling rate divided by the greatest common factor of samples; and
  a resampler that is configured to resample the sample blocks at a sampling rate that is no higher than a maximum of the first sampling rate or the second sampling rate.

16. A system of claim 15 wherein the resampler is further configured to resample the sample blocks at a sampling rate that is a maximum of the first sampling rate divided by the greatest common factor or the second sampling rate divided by the greatest common factor.

17. An audio reproducing system comprising:
  an audio signal input unit that is configured to generate a first digital audio stream;
  an audio signal storage unit that is configured to generate a second digital audio stream;
  a processor that is configured to resample a sampling rate of the generated first digital audio stream into a sampling rate of the generated second digital audio stream, to mix a first digital audio stream having the resampled sampling rate with the second digital audio stream, and to output a digital audio signal;
  a digital-to-analog converter that is configured to convert the output digital audio signal of the processor into an analog audio signal; and
  an audio signal output unit that is configured to reproduce an audio signal in response to the analog audio signal;
  wherein the processor is configured to resample by converting a sampling rate of samples included in sample blocks into which the first digital audio stream is divided using a predetermined conversion rate based on a greatest common factor of the sampling rates of the generated first and second digital audio streams, and to filter the samples at the converted sampling rate.

18. The system of claim 17, wherein the processor is configured to resample using one or more conversion rates for the samples.

19. The system of claim 17, wherein the sampling rate of the samples is determined by multiplying the sampling rate of the samples included in the sample blocks by the conversion rate of the samples.

20. The system of claim 17, wherein the processor is configured to resample by upsampling.

21. The system of claim 17, wherein the processor is configured to filter by low-pass filtering.

22. The system of claim 17, wherein the audio signal input unit includes a microphone.

23. The system of claim 17, wherein the audio signal storage unit includes a compact disk.

24. The system of claim 17, wherein the audio signal output unit includes a speaker.

25. The system of claim 17, wherein the processor includes a mixer that is configured to mix a first digital audio stream at the resampled sampling rate with the second digital audio stream.

26. A method of converting a signal from a first sampling rate to a second sampling rate, wherein the first and second sampling rates are not related as integer multiples, the method comprising:
  dividing the signal into a greatest common factor of the first and second sampling rates of sample blocks per second, wherein a respective sample block includes the first sampling rate divided by the greatest common factor, of samples; and
  resampling the sample blocks at a sampling rate that is no higher than a maximum of the first sampling rate or the second sampling rate.

27. A method of claim 26 wherein the resampling comprises:
  resampling the sample blocks at a sampling rate that is a maximum of the first sampling rate divided by the greatest common factor or the second sampling rate divided by the greatest common factor.

* * * * *